United States Patent [19]

Khajezadeh

[11] 3,916,431

[45] Oct. 28, 1975

[54] BIPOLAR INTEGRATED CIRCUIT TRANSISTOR WITH LIGHTLY DOPED SUBCOLLECTOR CORE

[75] Inventor: Heshmat Khajezadeh, Somerville, N.J.

[73] Assignee: RCA Corporation, New York, N.Y.

[22] Filed: June 21, 1974

[21] Appl. No.: 481,747

[52] U.S. Cl. .................. 357/48; 148/175; 148/187; 357/34; 357/89; 357/90

[51] Int. Cl.²....................H01L 21/20; H01L 27/04; H01L 29/72

[58] Field of Search ............ 357/34, 44, 48, 86, 89, 357/90

[56] References Cited

UNITED STATES PATENTS

| | | | |
|---|---|---|---|
| 3,482,111 | 12/1969 | Gunderson et al. | 357/44 |
| 3,510,736 | 5/1970 | Dingwall | 357/34 |
| 3,590,345 | 6/1971 | Brewer et al. | 357/86 |
| 3,676,714 | 7/1972 | Wensink et al. | 357/48 |

*Primary Examiner*—William D. Larkins
*Attorney, Agent, or Firm*—H. Christoffersen; R. P. Williams

[57] ABSTRACT

Crystal dislocations, in that portion of an epitaxial layer of semiconductive material over a buried pocket in a substrate in which a bipolar transistor's emitter is located, are reduced by providing the buried pocket with a lower concentration of conductivity modifiers under the emitter.

5 Claims, 4 Drawing Figures

BIPOLAR INTEGRATED CIRCUIT TRANSISTOR WITH LIGHTLY DOPED SUBCOLLECTOR CORE

This invention relates to integrated circuit devices of the monolithic, junction-isolated type and to a method of making such devices. Integrated circuits of this kind are usually made in a silicon wafer composed of a substrate of relatively high resistivity of one type conductivity, usually P type, and a relatively high resistivity epitaxial layer of the opposite type conductivity grown on the substrate.

Many separate circuits are usually made at the same time in a single semiconductor wafer, and often these circuits include bipolar transistors. These transistors may have collector regions composed of portions of the epitaxial layer itself, and base and emitter regions formed by introducing appropriate conductivity modifiers into the collector regions.

Integrated circuit devices of this type conventionally include a high conductivity pocket in the substrate adjacent to the interface between the substrate and the epitaxial layer under each transistor to reduce the collector saturation resistance thereof. This high conductivity pocket has been positioned so that it lies beneath a substantial portion of the emitter region of the transistor. To produce the desired high conductivity, the doping level in the pocket has been relatively high, and this tends to produce imperfections in the crystal lattice in the substrate. These imperfections can be propagated into the epitaxial layer as it is grown on the substrate and can degrade the performance of the transistor.

It has been proposed to eliminate this disadvantage by omitting that portion of the high conductivity pocket which lies directly beneath the emitter. See Dingwall, U.S. Pat. No. 3,510,736, issued May 5, 1970. While the solution described in the Dingwall patent does eliminate the difficulties caused by crystal imperfections in the epitaxial layer, it has introduced some other problems which make it unsuitable for use with certain transistors, particularly those which are relatively large and which are required to carry relatively high currents. Devices with part of the buried pocket omitted under the emitter often exhibit unacceptably increased collector saturation resistance. PNP parasitic action involving a P type base region, an N type epitaxial layer, and a P type substrate has also been observed.

Figure 1:
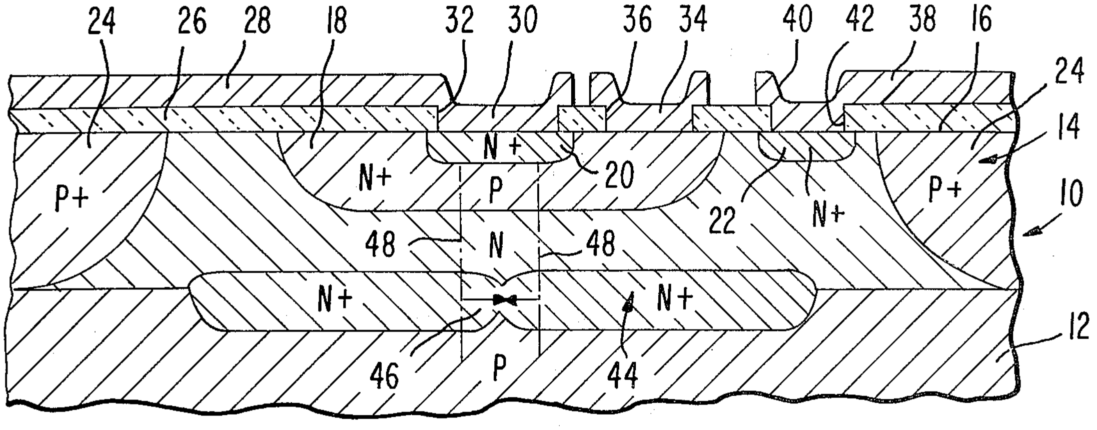
FIG. 1 is a partial cross-sectional view through one embodiment of the present novel integrated circuit device.

The present novel device is indicated generally by the reference numeral 10 in FIG. 1, which shows a portion of an integrated circuit device. Only one transistor is shown, but it will be understood by those of ordinary skill that the device 10 will incorporate many transistors, as well as other components, such as resistors and capacitors, for example.

The device 10 is a monolithic integrated circuit device of the junction-isolated type. It includes a substrate 12 of one type conductivity, P type in this example. On the substrate 12 is a layerlike body 14 of semiconductive material of conductivity type opposite to that of the substrate. By the term "opposite conductivity type" is meant that the layerlike body 14 has, in this example, N type conductivity as it is initially formed. The layerlike body 14 may be formed by epitaxial growth on the surface of a properly prepared substrate 12.

The layerlike body 14 contains means defining a bipolar transistor formed adjacent to a planar upper surface 16 thereof. This means comprises a base region 18 of P type conductivity, in this example, in the layerlike body 14 adjacent to the surface thereof. An emitter region 20, in this case of relatively high N (N+) type conductivity, is disposed within the base region 18, and although a plan view is not provided to show it, has a predetermined area and configuration in the plane of the surface 16. Where the device 10 is intended for operation at relatively high power levels, it is usual that the emitter region 20 be elongated, so that its periphery-to-area ratio is relatively high. These considerations are generally well known.

A collector contact diffusion 22 is provided to aid in making ohmic contact to the material of the layerlike body 14, which, in this embodiment, constitutes the collector of the bipolar transistor. Also contained within the layerlike body 14 are P+ type isolation diffusions, 24, which extend through the layerlike body 14 from the surface 16 thereof to the substrate 12 to isolate the transistor from other components in the device.

On the surface 16 of the body 14 is a conventional passivating and insulating coating 26, of thermal silicon dioxide for example. An emitter connection 28 disposed on the insulating layer 26 and has a portion 30 thereof which extends through an opening 32 in the coating 26 into contact with the emitter region 20. A base contact 34 extends through an opening 36 in the insulating coating 26 to contact the base region. A collector contact 38 is disposed on the insulating coating 26 and has a portion 40 thereof which extends through an opening 42 in the insulating coating 26 to contact the collector contact region 22.

In most integrated circuit devices of the junction-isolated type, a buried pocket region of the opposite type conductivity, i.e., N type, is disposed in the substrate opposite to the area of the emitter region and extending beyond this area. The buried pocket region is a means for reducing the collector saturation resistance of the transistor. It acts like a low resistance in parallel with other material of the collector of lower doping concentration and thus serves to lower the overall resistance of the collector. Structures of this kind are described, for example, in Murphy, U.S. Pat. No. 3,237,062, Porter, U.S. Pat. No. 3,260,902, and in the above-mentioned Dingwall patent, as well as others. In the device 10, there is also a buried N+ pocket, in this example designated by the reference numeral 44. It is the construction of the buried pocket 44 which distinguishes the present invention from the prior art.

As will appear from the description of the present novel process below, the buried pocket 44 in the present device 10 has a novel structure. In this novel structure, the density of conductivity modifiers in a substantial portion of that part of the pocket region which is disposed directly opposite the central area of the emitter region is less than the density of conductivity modifiers in those parts of the pocket region which are disposed opposite the outer peripheral area of the emitter region and in those parts which lie beyond the periphery of the emitter region. In other words, there is a portion of the pocket 44, designated 46 in the drawing, which is doped less heavily than the remainder of the buried pocket 44. The less heavily doped region 46 lies substantially in a zone defined by the two dashed lines 48 in FIG. 1 which, projected upwardly, intercept the emitter region 20 and define between them a central area of the emitter region 20. To the right and to the left of the area defined by the dashed lines 48 in FIG. 1, the structure is identical with known structures. Between the dashed lines 48, where the doping concentration in the pocket 44 is less, the present novel device approaches the advantages expressed in the Dingwall patent, above-mentioned, in that there are less dislocations which can propagate up into the epitaxial layer during growth, thus improving yields. The device is superior to the Dingwall structure, however, in that there is a continuous buried pocket underlying the entire area of the emitter in the manner of the Murphy patent such that the benefits of both structures are substantially achieved.

Figure 3:
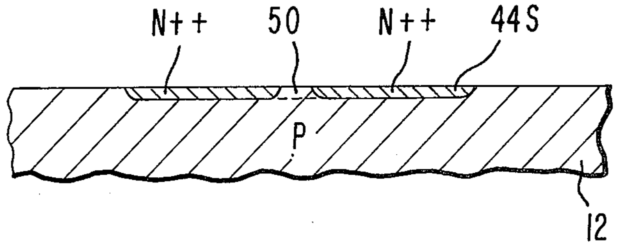
FIG. 3 is a cross section taken on the line 3—3 of FIG. 2.
Figure 4:
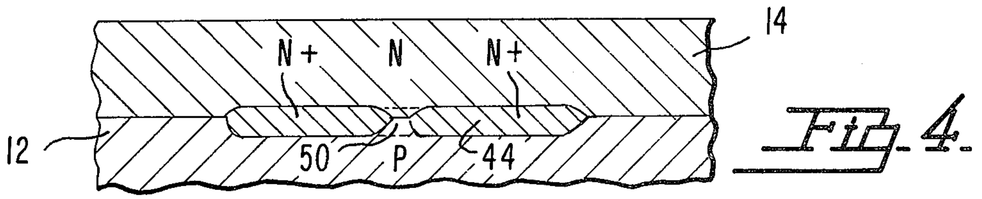
FIG. 4 is a cross-sectional view showing the configuration of the pocket region of FIGS. 2 and 3 after the formation of an epitaxial layer for the device.

The present novel method will be described with reference to FIGS. 2 to 4. The essential features of the process will be explained and conventional steps of cleaning and polishing, for example, will be omitted.

The process begins with a polished wafer 12, of P type conductivity in this example, and having a resistivity between about 5 and about 10 ohm-cm. By means of conventional masking and photolithographic procedures, a region 44s of relatively high N type conductivity, designated N++ in FIGS. 2 and 3, is introduced into the substrate 12.

The pocket diffusion may be carried out by conventional deposition and drive-in techniques. For the deposition step after the appropriate mask is provided on the surface of the substrate 12, the masked wafers are placed in a two-zone furnace, in which the wafers are heated to a temperature of about 1250°C. At a cooler zone of the furnace, a source of a donor impurity, for example, an antimony source such as antimony trioxide, $Sb_2O_3$, is heated to a temperature of about 600°C. The deposition step is preferably carried out for approximately 2 hours, to produce the region 44s, which thus comprises a deposited diffusion source of antimony adjacent to the surface of the substrate 12.

Figure 2:
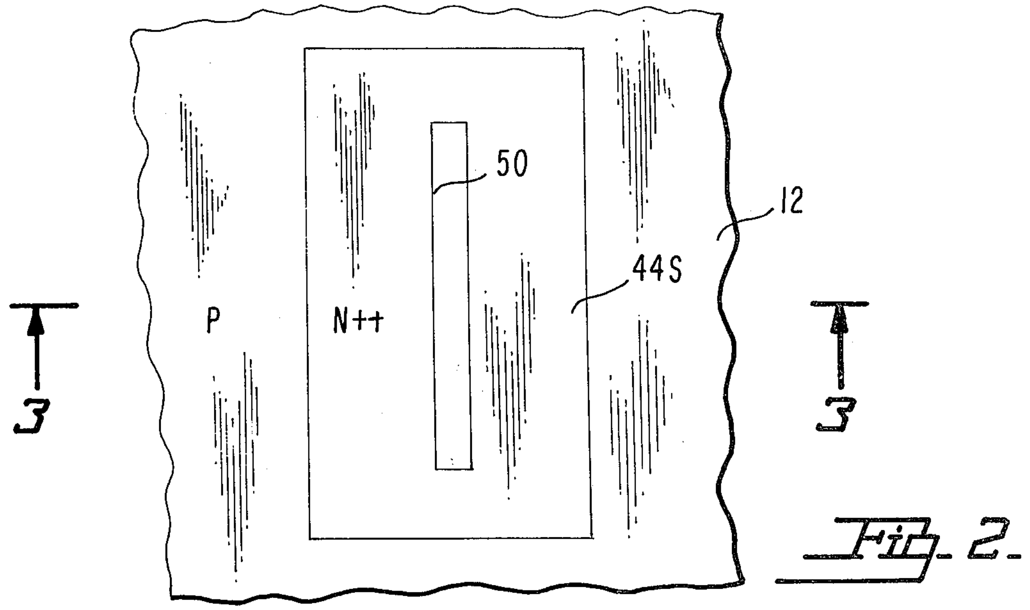
FIG. 2 is a partial plan view of a substrate surface showing the configuration of an initially-formed pocket region, in one example of the present novel method.

The configuration of the deposited source region 44s for the pocket diffusion is shown in FIG. 2 when an elongated emitter is used. The source 44s is provided with an elongated slot 50, i.e., an undiffused region which underlies a substantial part of the area over which the emitter will eventually be made. In one example of the present method, the emitter was designed to have a width of 1.0 mil (0.025 mm.). The slot 50 was designed to have an initial width of about 60 percent of the width of the emitter, or 0.6 mils (0.015 mm.) in this example. It has been found that the zone 46 of the buried pocket 44 need not underlie all of the emitter but should underlie at least about 60 percent of the emitter area in order to be effective.

The configuration of the buried pocket 44 is produced by driving in the source 44s prior to and during the growth of the layerlike body 14. Prior to the growth of body 14, the substrate 12 is preferably heated to a temperature of about 1,200°C in an oxidizing atmosphere for a period of about two to about five hours. This produces diffusion of the donors from the source region 44s into the substrate 12, including a substantial amount of side diffusion. In one example, the drive-in was carried out for 4 hours, resulting in a sheet resistivity of about 12 to about 14 ohms per square, and a junction depth of about 8 to about 10 micrometers (0.32 to 0.4 mils).

The next step in the process is to grow the layerlike body 14, and this is done in conventional manner, as by the thermal decomposition of silicon tetrachloride ($SiCl_4$). The result of this step is shown in FIG. 4, where the buried pocket 44 is shown as extending somewhat into the body 14. This results from diffusion of conductivity modifiers into the body 14 during its growth. The diffusion conditions, however, are chosen such that the side diffusion into the slot 50 is not enough to completely close the slot, and this is suggested in FIG. 4. The reason for this procedure is to allow the slot 50 to close by side diffusion during further processing, for example, during diffusion of the isolation diffusions 24 and the other regions of the device 10. The distribution of conductivity modifiers produced by the side diffusion is such that the density of conductivity modifiers in the portion 46 of the pocket 44 decreases as a function of distance parallel to the surface of the device from the outer peripheral area of the emitter region toward the center thereof.

From this point on, the process is entirely conventional. The isolation diffusions 24 are next produced, after which a so-called B and R diffusion is carried out to form the base region 18 as well as any resistors which might be required in the device 10. Finally, a diffusion is carried out to produce the emitter region 20 and the collector contact region 22 and other similar regions, after which conventional processes are used to form the oxide coating 26 and the metallization resulting in the conductors 28, 34, and 38. Again, during this latter processing, further diffusion will take place in the buried pocket 44, finally resulting in a configuration such as that shown in FIG. 1.

While the formation of the buried pocket 44 in this application has been described in terms of diffusion processes and with side diffusion as the principal means for obtaining the desired lower doping in the region 46, it will be understood by those of ordinary skill that other processes may be employed, so long as they result in the production of a region in which the density of conductivity modifiers in the buried pocket is less in the area disposed adjacent to the central area of the emitter region. For example, a zone of lower doping concentration might be produced in the substrate 12 by the conventional process of ion implantation rather than by side diffusion.

The resulting structure in an integrated circuit device which can be manufactured with substantially higher yields than has been possible in the past. The major yield problem of high leakage currents in prior devices has been attributed to localized punch-through between the emitter-base and base-collector junctions, and this punch-through is in fact caused by dislocations resulting from the high doping on the N+ buried layer of the prior devices. The reduction in the doping concentration in the region 46 of the buried pocket 44 has resulted in a substantial decrease in these dislocations.

The fact that in the present device the N+ pocket will exist under all of the emitter, however, is such that significant PNP parasitic action will not take place.

What is claimed is:

1. In an integrated circuit device of the type which has a substrate of one type conductivity, a layerlike body of semiconductive material of opposite type conductivity on said substrate and having a surface, there being a substantially planar interface between said substrate of said layerlike body, means in said layer-like body defining a bipolar transistor, said means comprising a base region of said one type conductivity in said layerlike body, an emitter region of said opposite type conductivity in said base region and having a predetermine area and configuration in the plane of said surface, and a pocket region of said opposite type conductivity in said substrate disposed opposite to all the area of said emitter region beneath said interface and extending beyond the area of said emitter region, the improvement wherein the density of conductivity modifiers in a substantial portion of that part of said pocket region which is disposed opposite the central area of said emitter region is less than the density of conductivity modifiers in those parts of said pocket region disposed opposite the outer peripheral area of said emitter region.

2. An integrated circuit device as defined in claim 1, wherein the density of conductivity modifiers in that part of said pocket region opposite the central area of the emitter region decreases as a function of distance parallel to said surface from the outer peripheral area of said emitter region toward the center thereof.

3. An integrated circuit device as defined in claim 2, wherein said one type conductivity is P type.

4. An integrated circuit device comprising:

a substrate of semiconductive material of one type conductivity, an epitaxial layer of semiconductive material of opposite type conductivity on said substrate, means in said epitaxial layer defining a bipolar transistor including emitter, base, and collector regions, and a pocket region of said opposite type conductivity adjacent to the interface between said substrate and said layer, said pocket region having a portion thereof disposed within said substrate beneath said emitter region, the density of conductivity modifiers in said portion of said pocket region decreasing from a relatively high value beneath the outer peripheral areas of said emitter region to a relatively low value beneath the central area of said emitter region.

5. An integrated circuit device as defined in claim 4, wherein said semiconductive material is monocrystalline silicon.

* * * * *